(12) United States Patent
Inoue et al.

(10) Patent No.: US 9,337,749 B2
(45) Date of Patent: May 10, 2016

(54) ABNORMAL H-BRIDGE GATE VOLTAGE DETECTION

(71) Applicant: SEIKO EPSON CORPORATION, Tokyo (JP)

(72) Inventors: Katsumi Inoue, Shiojiri (JP); Atsushi Yamada, Nagoya (JP)

(73) Assignee: SEIKO EPSON CORPORATION, Tokyo (JP)

( * ) Notice: Subject to any disclaimer, the term of this patent is extended or adjusted under 35 U.S.C. 154(b) by 266 days.

(21) Appl. No.: 14/218,438

(22) Filed: Mar. 18, 2014

(65) Prior Publication Data

US 2014/0286061 A1    Sep. 25, 2014

(30) Foreign Application Priority Data

Mar. 25, 2013  (JP) ................. 2013-061555

(51) Int. Cl.
*H02M 1/08*   (2006.01)
*H02M 7/5387* (2007.01)
*H02M 1/32*   (2007.01)
*H03K 17/082* (2006.01)
*G01R 31/40*  (2014.01)
*H02P 29/02*  (2016.01)

(52) U.S. Cl.
CPC .............. *H02M 7/5387* (2013.01); *H02M 1/32* (2013.01); *H03K 17/0822* (2013.01); *G01R 31/40* (2013.01); *H02P 29/02* (2013.01); *H03K 2217/0045* (2013.01); *H03K 2217/0081* (2013.01)

(58) Field of Classification Search
CPC ............................. H02M 1/08; H02M 7/5387
USPC ................................................... 363/98, 132
See application file for complete search history.

(56) References Cited

U.S. PATENT DOCUMENTS

| | | | |
|---|---|---|---|
| 2011/0188163 A1 | 8/2011 | Ando | |
| 2014/0247001 A1* | 9/2014 | Moriya | H01L 27/092 318/400.29 |
| 2014/0285130 A1* | 9/2014 | Inoue | H02P 6/085 318/400.29 |
| 2014/0286061 A1* | 9/2014 | Inoue | H02M 7/5387 363/56.05 |
| 2014/0307495 A1* | 10/2014 | Fukuta | H02H 3/08 363/98 |
| 2015/0236592 A1* | 8/2015 | Inoue | H02M 3/158 318/445 |

FOREIGN PATENT DOCUMENTS

| | | |
|---|---|---|
| JP | A-2003-189683 | 7/2003 |
| JP | A-2008-42975 | 2/2008 |
| JP | A-2011-160598 | 8/2011 |

* cited by examiner

*Primary Examiner* — Jeffrey Sterrett
(74) *Attorney, Agent, or Firm* — Oliff PLC

(57) ABSTRACT

An electronic circuit includes a failure detection circuit that detects an abnormality of the gate potential of a transistor of a bridge circuit. The failure detection circuit monitors an output voltage of a drive circuit that is to be the gate potential of the transistor of the bridge circuit and, when detecting an abnormality, stops the drive circuit.

18 Claims, 15 Drawing Sheets

ABNORMAL H-BRIDGE GATE VOLTAGE DETECTION

BACKGROUND

1. Technical Field

The present invention relates to a circuit device and an electronic apparatus or the like.

2. Related Art

A technique of controlling the number of revolutions of a motor by controlling a chopping current is known as a technique for a motor driver that drives a DC motor. In this technique, a current flowing to an H-bridge circuit is converted to a voltage by a sense resistor, and the resultant voltage is compared with a reference voltage, to detect a chopping current. The detection result is fed back to a control circuit, to perform PWM control of a drive signal for the bridge circuit, thereby rotating a motor at a fixed rate. As such techniques for a motor driver, the techniques disclosed in JP-A-2003-189683 and JP-A-2008-042975 are known.

The H-bridge circuit of the motor driver has first to fourth transistors (switching elements) for driving, where the first and fourth transistors, and the second and third transistors, are connected electrically diagonally with respect to the motor. During the charge period, the first and fourth transistors are on, whereby the positive-side (+) terminal of the motor is set to a high-potential voltage and the negative-side (−) terminal is set to a low-potential voltage. During the decay period, the second and third transistors are on, whereby the positive-side terminal of the motor is set to a low-potential voltage and the negative-side terminal is set to a high-potential voltage. A drive current is thus allowed to flow to the DC motor, to perform drive control of the motor.

Such a motor driver is provided with a pre-driver circuit that outputs a drive signal to each of the transistors of the H-bridge circuit. In this case, in order to apply a proper voltage between the gate and source of each transistor of the H-bridge circuit, it is desirable to provide a bias circuit that supplies a bias voltage as a power supply voltage that sets the low or high level of the drive signal.

However, if a failure occurs in the bias supply circuit, etc., the gate voltage of a transistor of the H-bridge circuit may become abnormal, causing gate breakdown, etc., and this may result in flow of an overcurrent. If such an overcurrent flows, there is the possibility that breakdown, etc. of the motor may occur.

SUMMARY

An advantage of some aspects of the invention is providing a circuit device and an electronic apparatus or the like where occurrence of an abnormal condition caused by a failure, etc. of a bias circuit of a bridge circuit can be prevented or reduced.

According to a first aspect of the invention, a circuit device includes a bridge circuit having a first transistor provided between a node of a high-potential side power supply and a first node and a second transistor provided between the first node and a node of a low-potential side power supply, a pre-driver circuit that outputs a first drive signal and a second drive signal to a first gate node of the first transistor and a second gate node of the second transistor, respectively, a bias circuit that supplies a bias voltage as a power supply voltage that sets a low level of the first drive signal, and an abnormal condition detection circuit that detects an abnormal condition where a high voltage is applied between the gate and source of the first transistor, and, if detecting the abnormal condition, sets the gate-source voltage of the first transistor to a voltage lower than the high voltage.

In the first aspect of the invention, the bias voltage is supplied by the bias circuit as the power supply voltage that sets the low level of the first drive signal output from the pre-driver circuit. If an abnormal condition where a high voltage is applied between the gate and source of the first transistor of the bridge circuit is detected, the gate-source voltage of the first transistor is set to a voltage lower than the high voltage. By this setting, even if a failure, etc. of the bias circuit occurs, occurrence of an abnormal condition where a high voltage is applied between the gate and source of the first transistor can be effectively prevented or reduced.

It is preferable that the abnormal condition detection circuit be provided between the node of the high-potential side power supply and the first gate node of the first transistor, and include a switch circuit that is turned on when the abnormal condition is detected.

With the above configuration, the switch circuit is turned on when an abnormal condition is detected, whereby the first gate node of the first transistor is set to the voltage level of the high-potential side power supply. Thus, the gate-source voltage of the first transistor can be set to a voltage lower than the high voltage in the abnormal condition.

It is preferable that the abnormal condition detection circuit include a voltage detection circuit that detects whether or not the bias voltage has become lower than a predetermined voltage and output a control signal that turns on the switch circuit when the bias voltage has become lower than the predetermined voltage.

With the above configuration, when the bias voltage becomes lower than a predetermined voltage due to a failure, etc. of the bias circuit, this is detected as an abnormal condition, and the switch circuit is turned on, permitting setting of the gate-source voltage of the first transistor to a low voltage.

It is preferable that the switch circuit be constituted by a P-type transistor for switch use provided between the node of the high-potential side power supply and the first gate node of the first transistor, and the voltage detection circuit include a comparison circuit that compares the bias voltage with the predetermined voltage, and an SR latch circuit that receives a set signal at its set terminal and a comparison result signal from the comparison circuit at its reset terminal, and outputs a high level of the control signal to the P-type transistor for switch use when the set signal becomes active and a low level of the control signal to the P-type transistor for switch use when the comparison result signal becomes active.

With the above configuration, in the normal state, the SR latch circuit maintains the set state with the set signal, outputting the high-level control signal to the P-type transistor for switch use to allow the P-type transistor for switch use to stay off. Once an abnormal condition is detected, making the comparison result signal active, the SR latch circuit becomes the reset state. The SR latch circuit then outputs the low-level control signal to the P-type transistor for switch use, turning on the P-type transistor for switch use and thus permitting setting of the gate-source voltage of the first transistor to a low voltage. In this case, since the reset state of the SR latch circuit is maintained, the gate-source voltage of the first transistor can be set to a low voltage continuously without fail.

It is preferable that the pre-driver circuit include a P-type transistor for pre-driver use and an N-type transistor for pre-driver use provided in series between the node of the high-potential side power supply and a node of supplying the bias voltage, and the bias circuit supply the bias voltage to a source node of the N-type transistor for pre-driver use.

With the above configuration, when the N-type transistor for pre-driver use is turned on, the bias voltage from the bias circuit is supplied to the first gate node of the first transistor as the low-level voltage of the first drive signal. Thus, the gate-source voltage of the first transistor can be set to a proper voltage.

It is preferable that the abnormal condition detection circuit include a switch circuit for pre-driver protection that is provided between the node of the high-potential side power supply and the source node of the N-type transistor for pre-driver use and is turned on when the abnormal condition is detected.

With the above configuration, since the switch circuit for pre-driver protection is turned on when an abnormal condition is detected, a breakdown, etc. of a transistor of the pre-driver circuit can be prevented or reduced.

According to a second aspect of the invention, a circuit device includes a bridge circuit having a first transistor provided between a node of a high-potential side power supply and a first node and a second transistor provided between the first node and a node of a low-potential side power supply, a pre-driver circuit that outputs a first drive signal and a second drive signal to a first gate node of the first transistor and a second gate node of the second transistor, respectively, a bias circuit that supplies a bias voltage as a power supply voltage that sets a high level of the second drive signal, and an abnormal condition detection circuit that detects an abnormal condition where a high voltage is applied between the gate and source of the second transistor, and, if detecting the abnormal condition, sets the gate-source voltage of the second transistor to a voltage lower than the high voltage.

In the second aspect of the invention, the bias voltage is supplied by the bias circuit as the power supply voltage that sets the high level of the second drive signal output from the pre-driver circuit. If an abnormal condition where a high voltage is applied between the gate and source of the second transistor of the bridge circuit is detected, the gate-source voltage of the second transistor is set to a voltage lower than the high voltage. By this setting, even if a failure, etc. of the bias circuit occurs, occurrence of an abnormal condition where a high voltage is applied between the gate and source of the second transistor can be effectively prevented or reduced.

It is preferable that the abnormal condition detection circuit be provided between the second gate node of the second transistor and the node of the low-potential side power supply, and include a switch circuit that is turned on when the abnormal condition is detected.

With the above configuration, the switch circuit is turned on when an abnormal condition is detected, whereby the second gate node of the second transistor is set to the voltage level of the low-potential side power supply. Thus, the gate-source voltage of the second transistor can be set to a voltage lower than the high voltage in the abnormal condition.

It is preferable that the abnormal condition detection circuit include a voltage detection circuit that detects whether or not the bias voltage has become higher than a predetermined voltage and output a control signal that turns on the switch circuit when the bias voltage has become higher than the predetermined voltage.

With the above configuration, when the bias voltage becomes higher than a predetermined voltage due to a failure, etc. of the bias circuit, this is detected as an abnormal condition, and the switch circuit is turned on, permitting setting of the gate-source voltage of the second transistor to a low voltage.

It is preferable that the switch circuit be constituted by an N-type transistor for switch use provided between the second gate node of the second transistor and the node of the low-potential side power supply, and the voltage detection circuit include a comparison circuit that compares the bias voltage with the predetermined voltage, and an SR latch circuit that receives a reset signal at its reset terminal and a comparison result signal from the comparison circuit at its set terminal, and outputs a low level of the control signal to the N-type transistor for switch use when the reset signal becomes active and a high level of the control signal to the N-type transistor for switch use when the comparison result signal becomes active.

With the above configuration, in the normal state, the SR latch circuit maintains the reset state with the reset signal, outputting the low-level control signal to the N-type transistor for switch use to allow the N-type transistor for switch use to stay off. Once an abnormal condition is detected, making the comparison result signal active, the SR latch circuit becomes the set state. The SR latch circuit then outputs the high-level control signal to the N-type transistor for switch use, turning on the N-type transistor for switch use and thus permitting setting of the gate-source voltage of the second transistor to a low voltage. In this case, since the set state of the SR latch circuit is maintained, the gate-source voltage of the second transistor can be set to a low voltage continuously without fail.

It is preferable that the pre-driver circuit include a P-type transistor for pre-driver use and an N-type transistor for pre-driver use provided in series between a node that supplies the bias voltage and the node of the low-potential side power supply, and the bias circuit supply the bias voltage to a source node of the P-type transistor for pre-driver use.

With the above configuration, when the P-type transistor for pre-driver use is turned on, the bias voltage from the bias circuit is supplied to the second gate node of the second transistor as the high-level voltage of the second drive signal. Thus, the gate-source voltage of the second transistor can be set to a proper voltage.

It is preferable that the abnormal condition detection circuit include a switch circuit for pre-driver protection that is provided between the source node of the P-type transistor for pre-driver use and the node of the low-potential side power supply and be turned on when the abnormal condition is detected.

With the above configuration, since the switch circuit for pre-driver protection is turned on when an abnormal condition is detected, a breakdown, etc. of a transistor of the pre-driver circuit can be prevented or reduced.

It is preferable that the first transistor and the second transistor be high-voltage transistors, and the transistors constituting the pre-driver circuit, the bias circuit, and the abnormal condition detection circuit be low-voltage transistors.

By limiting the use of high-voltage transistors to the first and second transistors and using low-voltage transistors for the other circuits as described above, the size of the circuit device can be reduced.

It is preferable that the first transistor and the second transistor be transistors having a DMOS structure.

Using such a DMOS structure, the breakdown voltages of the first and second transistors can be made higher.

According to a third aspect of the invention, an electronic apparatus includes the circuit device described above.

BRIEF DESCRIPTION OF THE DRAWINGS

The invention will be described with reference to the accompanying drawings, wherein like numbers reference like elements.

DESCRIPTION OF EXEMPLARY EMBODIMENTS

The following describes in detail a preferred embodiment of the invention. It should be noted that the embodiment to be described hereinafter is not intended to unduly limit the scope of the invention defined by the appended claims and that the entire configuration to be described in the embodiment is not necessarily essential as the means for achieving the invention.

1. Bridge Circuit

First, the basic operation of a bridge circuit 10 will be described with reference to FIGS. 1A and 1B. The bridge circuit 10 has transistors Q1, Q2, Q3, and Q4 for driving a motor 100. Gate nodes NG1 to NG4 of these transistors Q1 to Q4 are driven with drive signals DG1 to DG4 from pre-drivers PR1 to PR4.

Figure 1A:
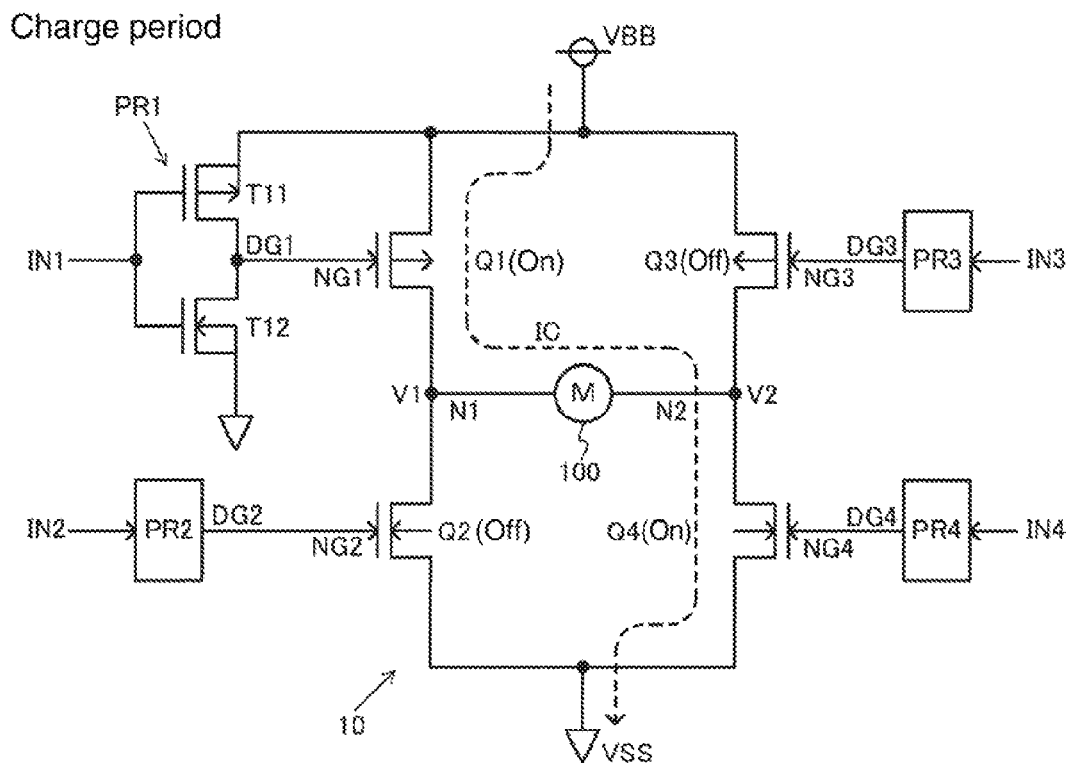
FIGS. 1A and 1B are explanatory diagrams of the operation of a bridge circuit.

During the charge period, as shown in FIG. 1A, the transistors Q1 and Q4 are on. This allows a charge current IC to flow from a power supply VBB on the high-potential side to a power supply VSS (GND) on the low-potential side via the transistor Q1, the motor 100 (motor coil), and the transistor Q4. By contrast, during the decay period, as shown in FIG. 1B, the transistors Q2 and Q3 are on. This allows a decay current ID to flow from the power supply VSS to the power supply VBB via the transistor Q2, the motor 100, and the transistor Q3. Both the charge current IC and the decay current ID flow through the motor 100 from its positive-side terminal to its negative-side terminal.

Figure 2:
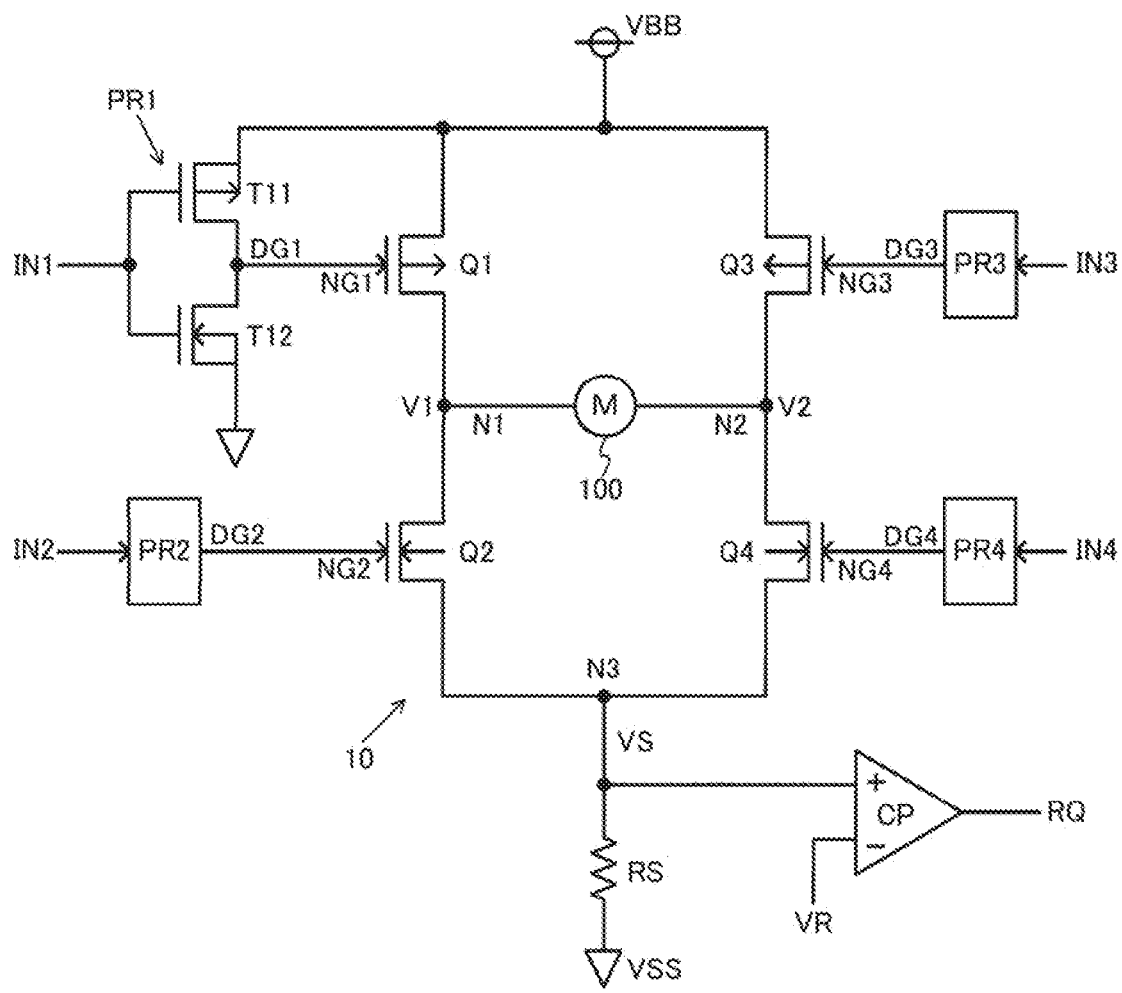
FIG. 2 is an explanatory diagram of a control technique of chopping operation using a sense resistor.
Figure 3:
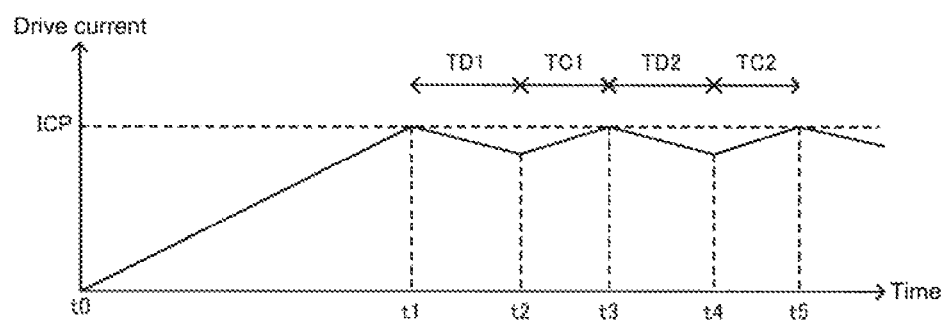
FIG. 3 is another explanatory diagram of the control technique of chopping operation using a sense resistor.

As shown in FIG. 2, a sense resistor RS is provided between a node N3 to which the sources of the transistors Q2 and Q4 are connected and the power supply VSS, and a comparison circuit (comparator) CP compares a voltage VS at the node N3 with a reference voltage VR. Then, as shown in FIG. 3, chopping operation of keeping a chopping current ICP flowing to the bridge circuit 10 constant is controlled. More specifically, the pulse width of a PWM signal is controlled so that the chopping current ICP be kept constant, and control signals for on/off of the transistors Q1 to Q4 are generated based on the PWM signal.

For example, when driving of the motor 100 is started at timing t0 in FIG. 3, the charge period shown in FIG. 1A starts, turning on the transistors Q1 and Q4 and turning off the transistors Q2 and Q3. This allows a drive current (charge current IC) to flow from the power supply VBB to the power supply VSS via the transistor Q1, the motor 100, and the transistor Q4. At timing t1, at which the drive current for the motor 100 reaches the chopping current ICP, the period is switched to a decay period TD1. More specifically, when the drive current becomes so large that the voltage VS at the node N3 exceeds the reference voltage VR, the output of the comparison circuit CP goes high from low, switching the period to the decay period TD1 at timing t1. The drive current for the motor 100 at the timing t1 is the chopping current ICP. The chopping current ICP is thus detected by detection of the voltage VS.

Figure 1B:
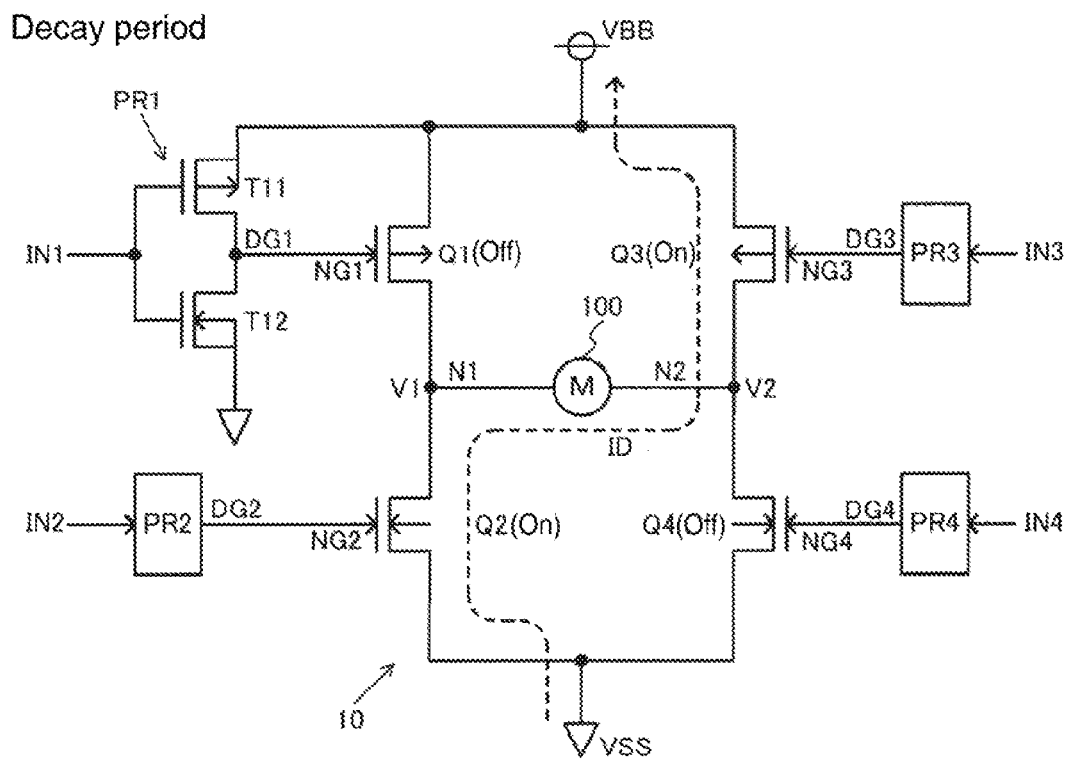

When the period is switched to the decay period TD1, the transistors Q2 and Q3 are turned on and the transistors Q1 and Q4 are turned off as shown in FIG. 1B. This allows a drive current (decay current ID) to flow from the power supply VSS to the power supply VBB via the transistor Q2, the motor 100, and the transistor Q3. During the decay period TD1, the drive current for the motor 100 decreases with time as shown in FIG. 3.

A circuit device (control circuit) then detects that a predetermined period of time has elapsed from the start of the decay period TD1 with a timer (counter circuit), for example, and switches the period from the decay period TD1 to a charge period TC1. In the charge period TC1, the drive current for the motor 100 increases, and once the drive current reaches the chopping current ICP, the period is changed to a decay period TD2. Then, by repeating this operation, the chopping current ICP as the peak current of the drive current is controlled to be constant, and thus the rotational speed of the motor 100 is kept constant.

Figure 4:
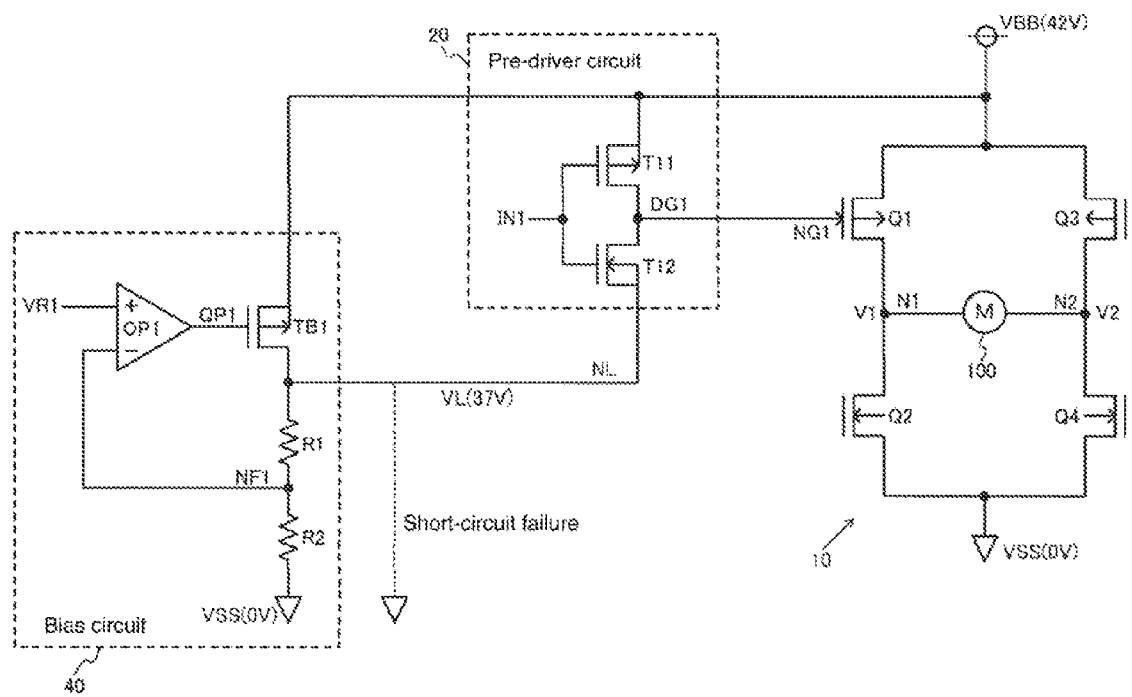
FIG. 4 is an explanatory diagram on occurrence of an abnormal condition on the high side caused by a failure, etc. of a bias circuit.

FIG. 4 shows a detailed example configuration of a high-side part of a circuit device of a motor driver. In FIG. 4, a pre-driver circuit 20 outputs the drive signal DG1 to the transistor Q1 of the bridge circuit 10.

In this case, the high-potential side power supply VBB has such a high voltage as 42V, for example. Therefore, a high-voltage transistor such as a transistor having a DMOS structure to be described later is used as the transistor Q1. In such a high-voltage transistor Q1, while a device breakdown will be less likely to occur even if a high voltage is applied between the drain and source thereof, there is the possibility that a device breakdown such as a gate breakdown may occur if a high voltage is applied between the gate and source thereof.

To overcome the problem described above, in FIG. 4, a bias circuit 40 is provided which supplies a bias voltage VL as the power supply voltage for setting the low level of the drive signal DG1. More specifically, the bias circuit 40 supplies the bias voltage VL to a supply node NL connected to the source of an N-type transistor T12 of the pre-driver circuit 20. The bias voltage VL is about 37V, for example.

With the provision of such a bias circuit 40, when an input signal IN1 of the pre-driver circuit 20 goes high turning on the N-type transistor T12, the low level of the drive signal DG1 is set to the voltage level of the bias voltage VL=37V. Therefore, a voltage of VBB−VL=42V−37V=5V is to be applied between the gate and source of the transistor Q1, permitting proper on/off control of the transistor Q1.

However, in FIG. 4, if a failure occurs in the bias circuit 40, etc. causing short-circuiting of the supply node NL to VSS (GND), for example, the voltage level at the gate node NG1 of the transistor Q1 will become about VSS=0V when the transistor T12 is turned on. As a result, an abnormal condition will occur where a voltage as high as about 42V, for example, is applied between the gate and source of the transistor Q1, causing a gate breakdown, etc. of the transistor Q1.

Figure 5:
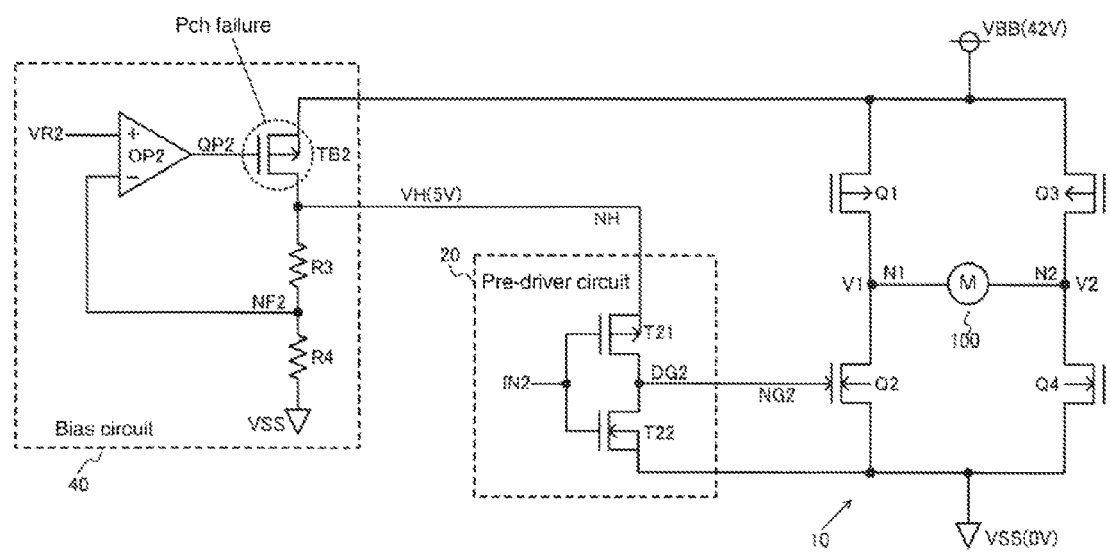
FIG. 5 is an explanatory diagram on occurrence of an abnormal condition on the low side caused by a failure, etc. of a bias circuit.

FIG. 5 shows a detailed example configuration of a low-side part of the circuit device of the motor driver. In FIG. 5, the pre-driver circuit 20 outputs the drive signal DG2 to the transistor Q2 of the bridge circuit 10. The bias circuit 40 supplies a bias voltage VH as the power supply voltage for setting the high level of the drive signal DG2. More specifically, the bias circuit 40 supplies the bias voltage VH to a supply node NH connected to the source of a P-type transistor T21 of the pre-driver circuit 20. The bias voltage VH is about 5V, for example. With this provision, when an input signal IN2 of the pre-driver circuit 20 goes low turning on the P-type transistor T21, the high level of the drive signal DG2 is set to the voltage level of the bias voltage VH=5V. Therefore, a voltage of VH−VSS=5V−0V=5V is to be applied between the gate and source of the transistor Q2, permitting proper on/off control of the transistor Q2.

However, in FIG. 5, if a failure occurs in the P-type transistor TB2, etc. of the bias circuit 40 causing a situation that the voltage at the supply node NH becomes the level of the power supply voltage VBB, the voltage level at the gate node NG2 of the transistor Q2 will become about VBB=42V when the transistor T21 is turned on. As a result, an abnormal condition will occur where a voltage as high as about 42V, for example, is applied between the gate and source of the transistor Q2, causing a gate breakdown, etc. of the transistor Q2.

2. Configuration of Circuit Device

Figure 6:
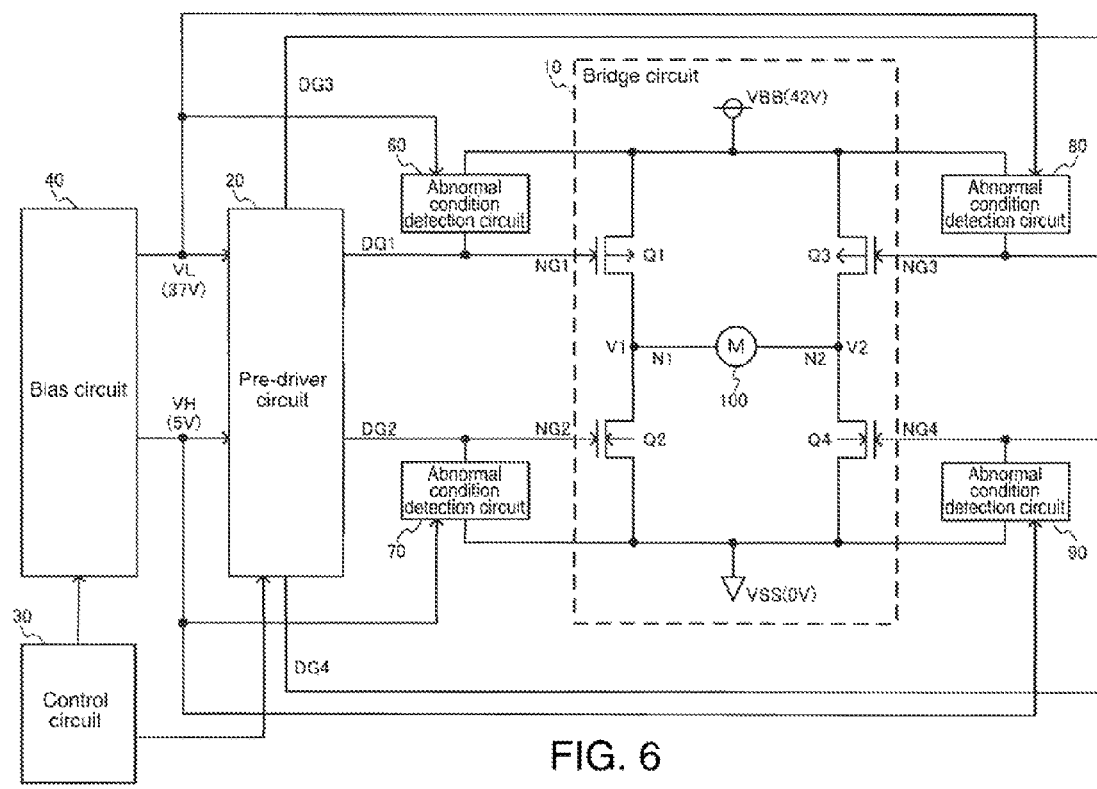
FIG. 6 shows an example configuration of a circuit device of an embodiment.

FIG. 6 shows an example configuration of a circuit device of this embodiment that can solve the problem of causing an abnormal condition as described above. The circuit device (motor driver) includes a bridge circuit 10, a pre-driver circuit 20, a control circuit 30, a bias circuit 40, and abnormal condition detection circuits 60, 70, 80, and 90.

Note that the configuration of the circuit device of this embodiment is not limited to that in FIG. 6, but various modifications such as omission of part of the components and addition of a new component can be made. For example, the sense resistor RS and the comparison circuit CP described with reference to FIG. 2 can be provided when the chopping control is involved. In this case, the sense resistor RS can be provided as an external component to the circuit device, and the comparison circuit CP, a circuit for generating the reference voltage VR, etc. can be provided as built-in circuits of the circuit device.

While FIG. 6 shows the case where the bridge circuit 10 is of an H-bridge type, this embodiment is not limited to this, but a half-bridge type may be used. Also, while both the high-side abnormal condition detection circuits 60 and 80 and the low-side abnormal condition detection circuits 70 and 90 are provided in FIG. 6, only the high-side or low-side abnormal condition detection circuits may be provided. In the case where the bridge circuit 10 is of the half-bridge type having only transistors Q0 and Q2, the abnormal condition detection circuits 80 and 90 will be unnecessary.

Note also that, while the embodiment will be described hereinafter taking the case of driving the motor 100 as an example, the object to be driven by the circuit device of this embodiment is not limited to the motor 100, but can be any of various elements and devices having an inductor (coil).

The bridge circuit 10 includes the first to fourth transistors Q1, Q2, Q3, and Q4. The first transistor Q1 is a P-type transistor provided between the node of a high-potential side power supply VBB and a first node N1. The second transistor Q2 is an N-type transistor provided between the first node N1 and the node of a low-potential side power supply VSS. The third transistor Q3 is a P-type transistor provided between the node of the power supply VBB and a second node N2. The fourth transistor Q4 is an N-type transistor provided between the second node N2 and the node of the power supply VSS. The first node N1 is a node connected to the positive-side terminal (first terminal in a broad sense) of the motor 100 (inductor in a broad sense), and the second node N2 is a node connected to the negative-side terminal (second terminal in a broad sense) of the motor 100.

The pre-driver circuit 20 is a circuit that drives the bridge circuit 10. More specifically, the pre-driver circuit 20 outputs a first drive signal DG1 and a second drive signal DG2 to a first gate node NG1 of the first transistor Q1 and a second gate node NG2 of the second transistor Q1, respectively. The pre-driver circuit 20 also outputs a third drive signal DG3 and a fourth drive signal DG4 to a third gate node NG3 of the third transistor Q3 and a fourth gate node NG4 of the fourth transistor Q4, respectively.

The control circuit 30 is a circuit that performs various types of control processing. For example, the control circuit 30 outputs on/off control signals to the pre-driver circuit 20 to perform on/off control of the transistors Q1 to Q4. When the chopping control as in FIG. 2 is performed, for example, the control circuit 30 controls the pulse width of the PWM signal so that the chopping current ICP flowing to the bridge circuit 10 be kept constant in response to the comparison result signal from the comparison circuit CP and a signal from the timer. Based on the resultant PWM signal, the control circuit 30 generates on/off control signals for the transistors Q1 to Q4, and outputs the control signals to the pre-driver circuit 20. Receiving these control signals, the pre-driver circuit 20 outputs the drive signals DG1 to DG4 to the transistors Q1 to Q4.

The bias circuit 40 generates bias voltages VL and VH and supplies them to the pre-driver circuit 20. More specifically, the bias circuit 40 generates the bias voltage VL as the power supply voltage for setting the low levels of the drive signals DG1 and DG3 for the transistors Q1 and Q3, and supplies the voltage to the pre-driver circuit 20. Likewise, the bias circuit 40 generates the bias voltage VH as the power supply voltage for setting the high levels of the drive signals DG2 and DG4 for the transistors Q2 and Q4, and supplies the voltage to the pre-driver circuit 20.

The abnormal condition detection circuit 60 (abnormal condition prevention circuit, failure prevention circuit) detects an abnormal condition (failure condition) where a high voltage may be applied between the gate and source of the transistor Q1 of the bridge circuit 10. More specifically, the abnormal condition detection circuit 60 detects whether or not a high voltage equal to or exceeding the gate-source breakdown voltage of the transistor Q1 has been applied. For example, the abnormal condition detection circuit 60 detects the abnormal condition by monitoring the bias voltage VL from the bias circuit 40. More specifically, the abnormal condition is detected by monitoring whether the bias voltage VL (e.g., 37V) has become lower than a predetermined voltage (e.g., 36V).

When detecting the abnormal condition, the abnormal condition detection circuit 60 sets the gate-source voltage of the transistor Q1 to a voltage (e.g., 0V) lower than the high voltage (e.g., 42V) in the abnormal condition.

The abnormal condition detection circuit 60 is provided between the node of the high-potential side power supply VBB and the gate node NG1 of the transistor Q1, for example. When detecting the abnormal condition, the abnormal condition detection circuit 60 sets the voltage level at the gate node NG1 to the voltage level of the power supply VBB, for example. By this setting, the gate-source voltage of the transistor Q1 is set at 0V. Thus, occurrence of a gate breakdown, etc. of the transistor Q1 at an occurrence of the abnormal condition can be effectively prevented or reduced.

The abnormal condition detection circuit 70 detects an abnormal condition where a high voltage may be applied between the gate and source of the transistor Q2 of the bridge circuit 10. More specifically, the abnormal condition detection circuit 70 detects whether or not a high voltage equal to or exceeding the gate-source breakdown voltage of the transistor Q2 has been applied. For example, the abnormal condition detection circuit 70 detects the abnormal condition by monitoring the bias voltage VH from the bias circuit 40. More specifically, the abnormal condition is detected by monitoring whether the bias voltage VH (e.g., 5V) has become higher than a predetermined voltage (e.g., 6V).

When detecting the abnormal condition, the abnormal condition detection circuit 70 sets the gate-source voltage of the transistor Q2 to a voltage (e.g., 0V) lower than the high voltage (e.g., 42V) in the abnormal condition.

The abnormal condition detection circuit 70 is provided between the gate node NG2 of the transistor Q2 and the node of the low-potential side power supply VSS, for example. When detecting an abnormal condition, the abnormal condition detection circuit 70 sets the voltage level at the gate node NG2 to the voltage level of the power supply VSS, for example. By this setting, the gate-source voltage of the transistor Q2 is set at 0V. Thus, occurrence of a gate breakdown, etc. of the transistor Q2 at an occurrence of the abnormal condition can be effectively prevented or reduced.

The configurations and operations of the abnormal condition detection circuits 80 and 90 provided in correspondence with the transistors Q3 and Q4 of the bridge circuit 10 are similar to those of the abnormal condition detection circuits 60 and 70.

For example, the abnormal condition detection circuit 80 detects an abnormal condition where a high voltage may be applied between the gate and source of the transistor Q3, and, when detecting an abnormal condition, sets the gate-source voltage of the transistor Q3 to a voltage lower than the high voltage. The abnormal condition detection circuit 80 is provided between the node of the power supply VBB and the gate node NG3, for example. The abnormal condition detection circuit 80 monitors the bias voltage VL, to detect the abnormal condition when the bias voltage VL has become lower than a predetermined voltage, and sets the voltage level at the gate node NG3 of the transistor Q3 to the voltage level of the power supply VBB, for example.

Similarly, the abnormal condition detection circuit 90 detects an abnormal condition where a high voltage may be applied between the gate and source of the transistor Q4, and, when detecting an abnormal condition, sets the gate-source voltage of the transistor Q4 to a voltage lower than the high voltage. The abnormal condition detection circuit 90 is provided between the gate node NG4 and the node of the power supply VSS, for example. The abnormal condition detection circuit 90 monitors the bias voltage VH, to detect the abnormal condition when the bias voltage VH has become higher than a predetermined voltage, and sets the voltage level at the gate node NG4 of the transistor Q4 to the voltage level of the power supply VSS, for example.

As described above, in this embodiment, provided are the abnormal condition detection circuits 60, 70, 80, and 90 that detect an abnormal condition where a high voltage may be applied between the gates and sources of the corresponding transistors Q1 to Q4 of the bridge circuit 10. Once an abnormal condition is detected, the gate-source voltages of the transistors Q1 to Q4 are set to low voltages. By this setting, the problem of causing an abnormal condition as described with reference to FIGS. 4 and 5 can be solved. In other words, even if the bias voltages VL and VH become abnormal voltages different from their desired voltages due to occurrence of a failure in the bias circuit 40, etc., causing an abnormal condition where a high voltage may be applied between the gates and sources of the transistors Q1 to Q4, this abnormal condition is detected by the corresponding abnormal condition detection circuit 60, 70, 80, or 90. By setting the gate-source voltages of the transistors Q1 to Q4 at low voltages, occurrence of gate breakdowns, etc. of the transistors Q1 to Q4 can be prevented or reduced, permitting proper dealing with occurrence of an abnormal condition. For example, if a gate breakdown of any of the transistors Q1 to Q4 occurs, an overcurrent may flow to the motor 100, causing the possibility of breakdown of the motor 100 due to burning, etc. According to the circuit device of this embodiment, however, occurrence of such an event can be prevented or reduced.

As a comparative example to the technique of this embodiment, a technique is considerable where an overcurrent detection circuit is provided and, when an overcurrent caused by a gate breakdown, etc. of any of the transistors Q1 to Q4 is detected, the drive control is inactivated.

In the above comparative technique, however, which is a technique of detecting an overcurrent after occurrence of a device breakdown of any of the transistors Q1 to Q4, etc., the drive control cannot be inactivated until after detection of the device breakdown. It is therefore impossible to deter a device breakdown of any of the transistors Q1 to Q4, etc. that drive the motor 100. Moreover, if detection of an overcurrent is delayed, the possibility of causing an event such as burning of the motor 100 may arise.

According to the technique of this embodiment, if occurrence of an abnormal condition is detected, the gate-source voltages of the transistors Q1 to Q4 are set to low voltages, permitting prevention or reduction of device breakdown of the transistors Q1 to Q4. Also, since it is possible to detect an abnormal condition and inactivate the drive control before flowing of an overcurrent to the motor 100, breakdown, etc. of the motor 100 can be effectively prevented or reduced.

3. Detailed Configuration

Figure 7:
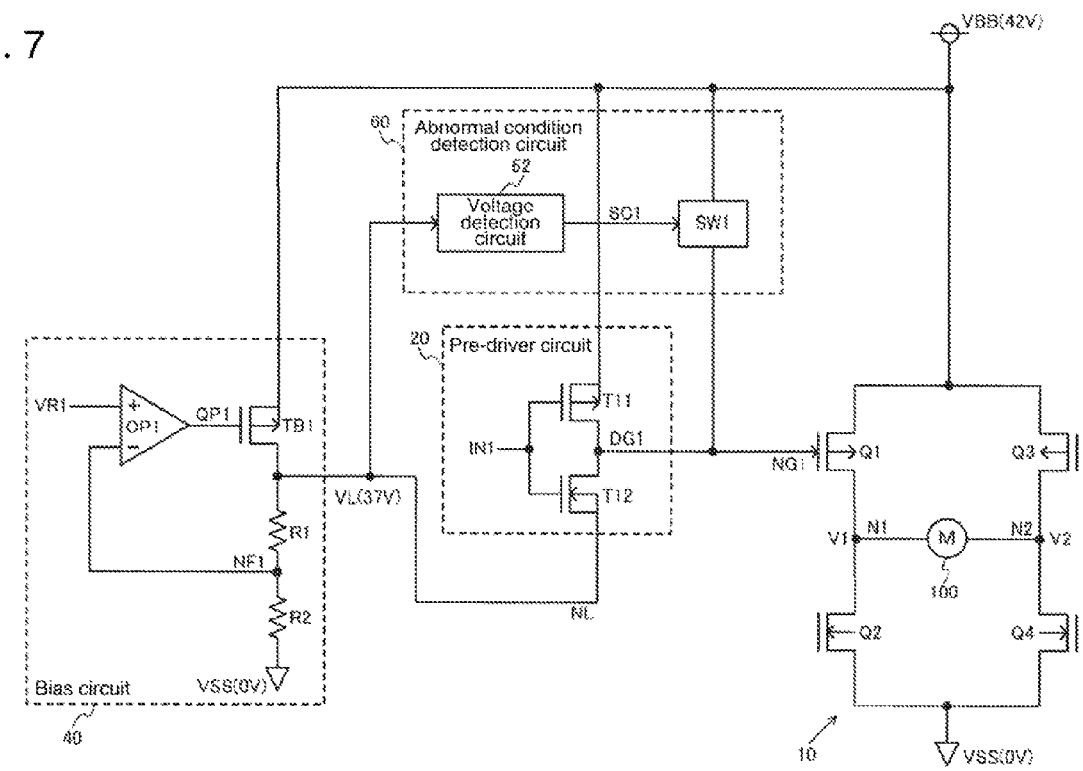
FIG. 7 shows a detailed example configuration of the circuit device of the embodiment on the high side.

Next, a detailed example configuration of the circuit device of this embodiment will be described. FIG. 7 is a diagram showing a detailed example configuration of the abnormal condition detection circuit 60 and the bias circuit 40 on the high side. Note that the configuration of the high-side abnormal condition detection circuit 80 (switch circuit, voltage detection circuit) shown in FIG. 6 is similar to that of the abnormal condition detection circuit 60, and thus a detailed description thereof is omitted here.

The bias circuit 40 on the high side includes a transistor TB1, resistors R1 and R2, and an operational amplifier OP1. The P-type transistor TB1 and the resistors R1 and R2 are provided in series between the node of the high-potential side power supply VBB and the node of the low-potential side power supply VSS (GND). The voltage at a resistance-dividing node NF1 between the resistors R1 and R2 is input into the inverting input terminal (second terminal) of the operational amplifier OP1. A reference voltage VR1 is input into the non-inverting input terminal (first terminal) of the operational amplifier OP1. An output signal QP1 of the operational amplifier OP1 is input into the gate of the transistor TB1.

Having such a regulator circuit configuration, the bias circuit 40 can supply the constant bias voltage VL as represented by equation (1) below.

$$VL = \{(R1+R2)/R2\} \times VR1 \quad (1)$$

The pre-driver circuit 20 (first pre-driver) has a P-type transistor T11 and an N-type transistor T12 for pre-driver use, for example. The transistors T11 and T12 are provided in series between the node of the high-potential side power supply VBB and the node NL that supplies the bias voltage VL. More specifically, the drains of the transistors T11 and T12 are connected to the gate node NG1 of the transistor Q1, and an input signal IN1 from the control circuit 30 in FIG. 6, for example, is input into the gates of the transistors T11 and T12. The input signal IN1 is an on/off control signal for the transistor Q1.

The bias circuit 40 outputs the bias voltage VL to the supply node NL connected to the source of the N-type transistor T12 for pre-driver use. Thus, the bias voltage VL is supplied as the power supply voltage (low-potential side power supply voltage) that sets the low level of the drive signal DG1 of the pre-driver circuit 20.

The abnormal condition detection circuit 60 includes a switch circuit SW1 and a voltage detection circuit 62. The switch circuit SW1 is provided between the node of the high-potential side power supply VBB and the gate node NG1 of the transistor Q1, and turned on when an abnormal condition is detected. That is, the switch circuit SW1 is off in the normal state and turned on from off with detection of an abnormal condition. Once the switch circuit SW1 is turned on, the voltage level at the gate node NG1 is set to the voltage level of the power supply VBB.

The voltage detection circuit 62 detects whether or not the bias voltage V1 (e.g., 37V) has become lower than a predetermined voltage (e.g., 36V). If the bias voltage VL has become lower than the predetermined voltage, the voltage detection circuit 62 outputs a control signal SC1 that turns on the switch circuit SW1. That is, the control signal SC1 is made active to turn on the switch circuit SW1. By this switching, the voltage level at the gate node NG1 is set to the voltage level of the power supply VBB.

By the above setting, both the gate and source of the transistor Q1 are set to the voltage level of the power supply VBB, resulting in setting of the gate-source voltage of the transistor Q1 to a low voltage (0V). Accordingly, even if there occurs an abnormal condition such as short-circuiting to the power supply VSS as described with reference to FIG. 4, it is possible to effectively prevent or reduce occurrence of a gate breakdown of the transistor Q1 due to application of a high voltage between the gate and source of the transistor Q1. Thus, device breakdown of the transistor Q1 is prevented or reduced, and also such an event that an overcurrent may flow to the motor 100 causing breakdown of the motor can be prevented or reduced.

Figure 8:
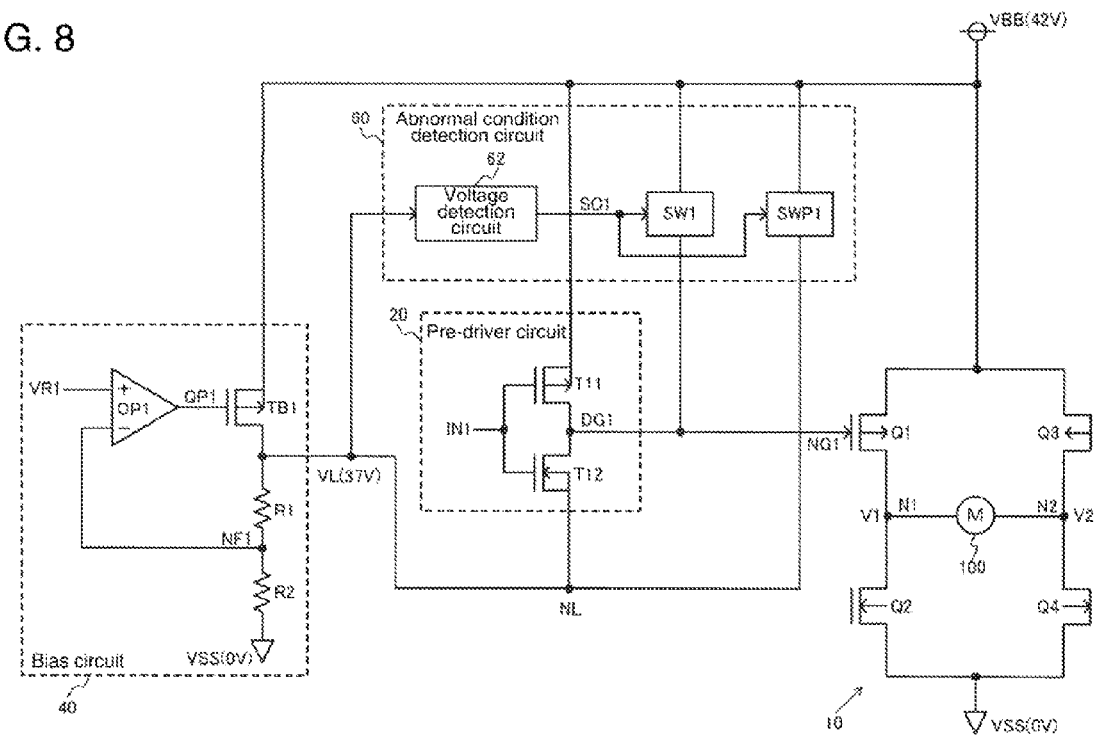
FIG. 8 shows an example configuration having a switch circuit for protection of a pre-driver circuit.

A switch circuit SWP1 for pre-driver protection as shown in FIG. 8 may be further provided. That is, in FIG. 8, the abnormal condition detection circuit 60 includes the switch circuit SWP1 for pre-driver protection that is provided between the node of the power supply VBB and the source node (NL) of the N-type transistor T12 for pre-driver use and is turned on when an abnormal condition is detected. The control signal SC1 from the voltage detection circuit 62 is input into the switch circuit SWP1, for example. When the control signal SC1 becomes active with detection of an abnormal condition where the bias voltage VL becomes lower than a predetermined voltage, for example, the switch circuit SWP1 for pre-driver protection is turned on. With this switching, the source node (NL) of the transistor T12 of the pre-driver circuit 20 is set to the voltage level of the power supply VBB. Thus, breakdown of the transistor T12 (pre-driver circuit) can also be prevented or reduced.

Figure 9:
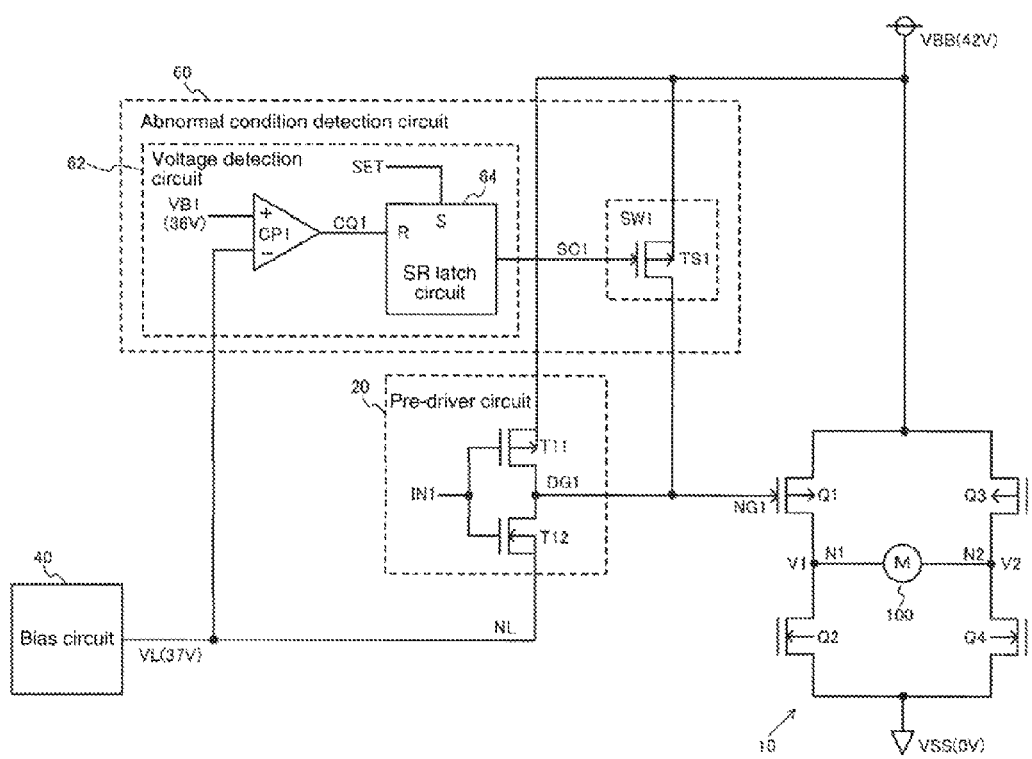
FIG. 9 shows a detailed example configuration of a switch circuit and a voltage detection circuit on the high side.

FIG. 9 is a diagram showing a detailed example configuration of the switch circuit SW1 and the voltage detection circuit 62 on the high side.

As shown in FIG. 9, the switch circuit SW1 is constituted by a P-type transistor TS1 for switch use provided between the node of the power supply VBB and the gate node NG1 of the transistor Q1. The control signal SC1 from the voltage detection circuit 62 is input into the gate of the transistor TS1, to perform on/off control of the transistor TS1 with the control signal SC1. Note that the switch circuit SWP1 for pre-driver protection described with reference to FIG. 8 can also be constituted by a P-type transistor similar to the transistor TS1 constituting the switch circuit SW1.

The voltage detection circuit 62 includes a comparison circuit CP1 and an SR latch circuit 64. The comparison circuit CP1 compares the bias voltage VL (e.g., 37V) with a predetermined voltage VB1 (e.g., 36V). The comparison circuit CP1 can be constituted by a comparator, for example.

The SR latch circuit 64 receives a set signal SET at its set terminal and a comparison result signal CQ1 from the comparison circuit CP1 at its reset terminal. The SR latch circuit 64 outputs a high level of the control signal SC1 to the transistor TS1 when the set signal SET becomes active. By contrast, the SR latch circuit 64 outputs a low level of the control signal SC1 to the transistor TS1 when the comparison result signal CQ1 from the comparison circuit CP1 becomes active.

In the normal state, for example, with the set signal SET being active, the SR latch circuit 64 is in the set state, allowing the SR latch circuit 64 to output a high level of the control signal SC1. The transistor TS1, which is a P-type transistor, is off when the control signal SC1 is high.

Once the bias voltage VL becomes lower than the predetermined voltage VB1, detecting an abnormal condition such as short-circuiting to VSS (GND), the output signal. CQ1 of the comparison circuit CP1 becomes active. This puts the SR latch circuit 64 in the reset state, allowing the SR latch circuit 64 to output a low level of the control signal SC1. As a result, the P-type transistor TS1 is turned on, setting the gate node NG1 to the voltage level of the power supply VBB. In this way, when an abnormal condition is detected, the gate-source voltage of the transistor Q1 is set to a low voltage, permitting prevention or reduction of device breakdown of the transistor Q1.

Once being put in the set or reset state, the SR latch circuit 64 retains the state. Accordingly, when the SR latch circuit 64 is put in the set state with the set signal SET becoming active in the normal state, the set state is retained, and thus the off state of the transistor TS1 is also maintained.

When an abnormal condition is detected, putting the SR latch circuit 64 in the reset state, the reset state is retained, and thus the on state of the transistor TS1 is also maintained. Accordingly, the gate-source voltage of the transistor Q1 can be set to a low voltage continuously without fail, permitting improvement of reliability, etc.

Figure 10:
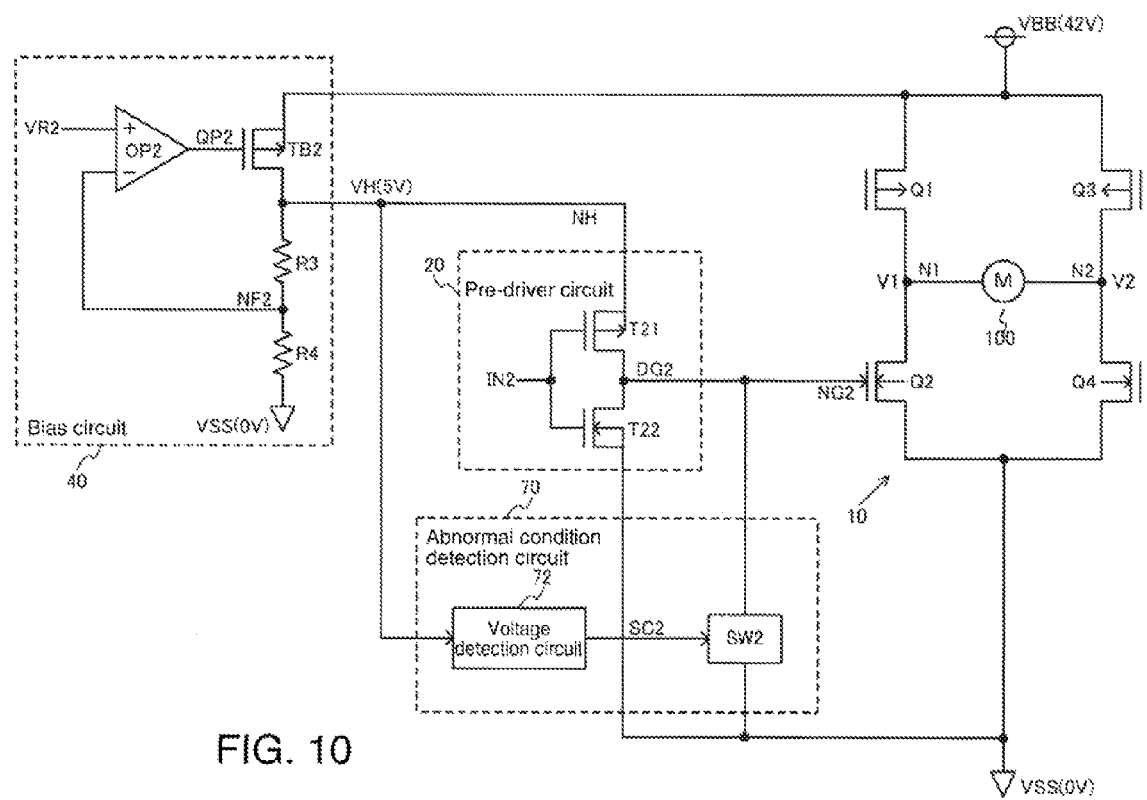
FIG. 10 shows a detailed example configuration of the circuit device of the embodiment on the low side.

FIG. 10 is a diagram showing a detailed example configuration of the abnormal condition detection circuit 70 and the bias circuit 40 on the low side. Note that the configuration of the low-side abnormal condition detection circuit 90 (switch circuit, voltage detection circuit) shown in FIG. 6 is similar to that of the abnormal condition detection circuit 70, and thus a detailed description thereof is omitted here.

The bias circuit 40 on the low side includes a transistor TB2, resistors R3 and R4, and an operational amplifier OP2. The P-type transistor TB2 and the resistors R3 and R4 are provided in series between the node of the power supply VBB and the node of the power supply VSS. The voltage at a resistance-dividing node NF2 between the resistors R3 and R4 is input into the inverting input terminal of the operational amplifier OP2. A reference voltage VR2 is input into the non-inverting input terminal of the operational amplifier OP2. An output signal QP2 of the operational amplifier OP2 is input into the gate of the transistor TB2.

Having such a regulator circuit configuration, the bias circuit 40 can supply the constant bias voltage VH as represented by equation (2) below.

$$VH = \{(R3+R4)/R4\} \times VR2 \qquad (2)$$

The pre-driver circuit 20 (second pre-driver) has a P-type transistor T21 and an N-type transistor T22 for pre-driver use, for example. The transistors T21 and T22 are provided in series between the node NH that supplies the bias voltage VH and the node of the power supply VSS. More specifically, the drains of the transistors T21 and T22 are connected to the gate node NG2 of the transistor Q2, and an input signal IN2 from the control circuit 30 in FIG. 6, for example, is input into the gates of the transistors T21 and T22. The input signal IN2 is an on/off control signal for the transistor Q2.

The bias circuit 40 outputs the bias voltage VH to the supply node NH connected to the source of the P-type transistor T21 for pre-driver use. Thus, the bias voltage VH is supplied as the power supply voltage (high-potential side power supply voltage) for setting the high level of the drive signal DG2 of the pre-driver circuit 20.

The abnormal condition detection circuit 70 includes a switch circuit SW2 and a voltage detection circuit 72. The switch circuit SW2 is provided between the gate node NG2 of the transistor Q2 and the node of the low-potential side power supply VSS, and is turned on when an abnormal condition is detected. That is, the switch circuit SW2 is off in the normal state and turned on from off with detection of an abnormal condition. Once the switch circuit SW2 is turned on, the voltage level at the gate node NG2 is set to the voltage level of the power supply VSS.

The voltage detection circuit 72 detects whether or not the bias voltage VH (e.g., 5V) has become higher than a predetermined voltage (e.g., 6V). If the bias voltage VH has become higher than the predetermined voltage, the voltage detection circuit 72 outputs a control signal SC2 that turns on the switch circuit SW2. That is, the control signal SC2 is made active to turn on the switch circuit SW2. By this switching, the voltage level at the gate node NG2 is set to the voltage level of the power supply VSS.

By the above setting, both the gate and source of the transistor Q2 are set to the voltage level of the power supply VSS, resulting in setting of the gate-source voltage of the transistor Q2 to a low voltage (0V). Accordingly, even if there occurs an abnormal condition such as a failure of the P-type transistor TB2 as described with reference to FIG. 5, it is possible to effectively prevent or reduce occurrence of a gate breakdown of the transistor Q2 due to application of a high voltage between the gate and source of the transistor Q2. Thus, device breakdown of the transistor Q2 is prevented or reduced, and also such an event that an overcurrent may flow to the motor 100 causing breakdown of the motor 100 can be prevented or reduced.

Figure 11:
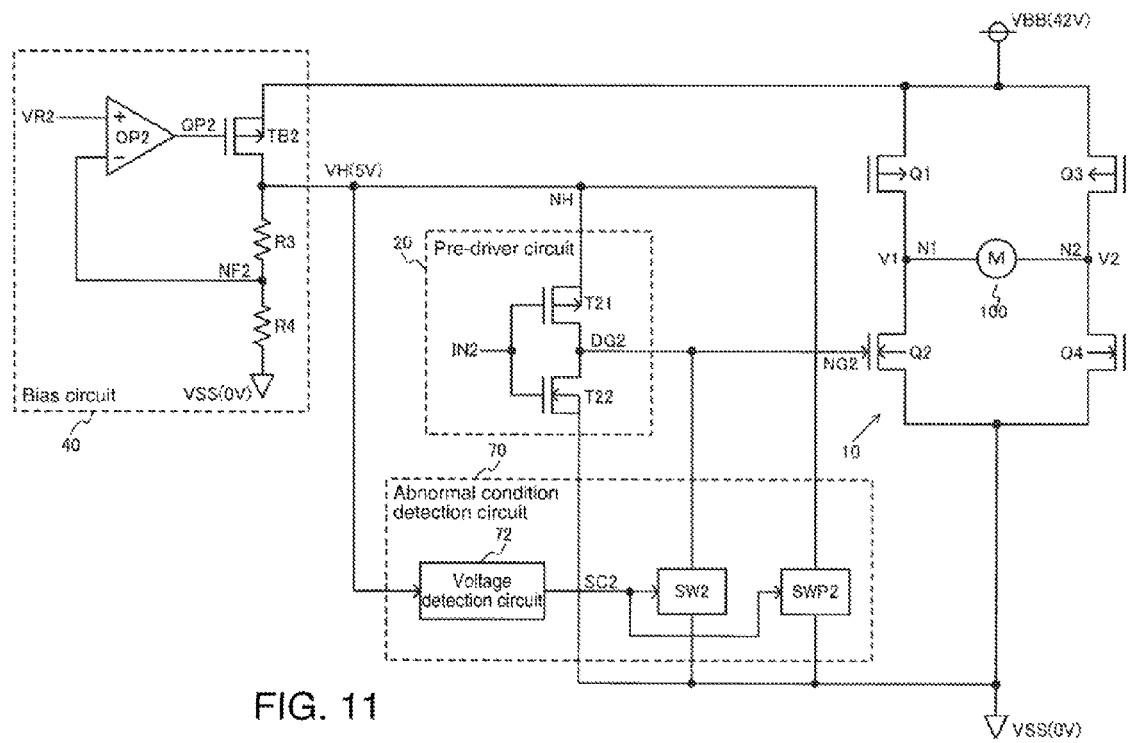
FIG. 11 shows an example configuration having a switch circuit for protection of a pre-driver circuit.

A switch circuit SWP2 for pre-driver protection as shown in FIG. 11 may be further provided. That is, in FIG. 11, the abnormal condition detection circuit 70 includes the switch circuit SWP2 for pre-driver protection that is provided between the source node (NH) of the P-type transistor T21 for pre-driver use and the node of the power supply VSS and is turned on when an abnormal condition is detected. The control signal SC2 from the voltage detection circuit 72 is input into the switch circuit SWP2, for example. When the control signal SC2 becomes active with detection of an abnormal condition where the bias voltage VH becomes higher than a predetermined voltage, for example, the switch circuit SWP2 for pre-driver protection is turned on. With this switching, the source node (NH) of the transistor T21 of the pre-driver circuit 20 is set to the voltage level of the power supply VSS. Thus, breakdown of the transistor T12 (pre-driver circuit) can also be prevented or reduced.

Figure 12:
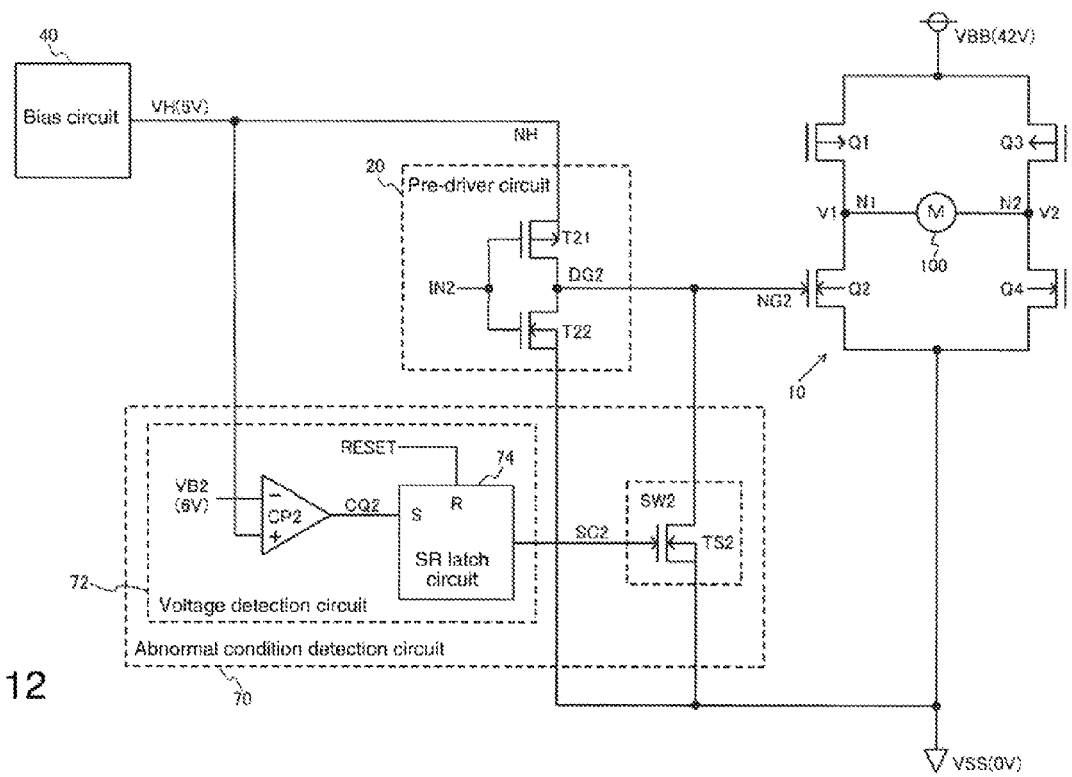
FIG. 12 shows a detailed example configuration of a switch circuit and a voltage detection circuit on the low side.

FIG. 12 is a diagram showing a detailed example configuration of the switch circuit SW2 and the voltage detection circuit 72 on the low side.

As shown in FIG. 12, the switch circuit SW2 is constituted by an N-type transistor TS2 for switch use provided between the gate node NG2 of the transistor Q2 and the node of the power supply VSS. The control signal SC2 from the voltage detection circuit 72 is input into the gate of the transistor TS2, to perform on/off control of the transistor TS2 with the control signal SC2. Note that the switch circuit SWP2 for pre-driver protection described with reference to FIG. 11 can also be constituted by an N-type transistor similar to the transistor TS2 constituting the switch circuit SW2.

The voltage detection circuit 72 includes a comparison circuit CP2 and an SR latch circuit 74. The comparison circuit CP2 compares the bias voltage VH (e.g., 5V) with a predetermined voltage VB2 (e.g., 6V). The comparison circuit CP2 can be constituted by a comparator, for example.

The SR latch circuit 74 receives a reset signal RESET at its reset terminal and a comparison result signal CQ2 from the comparison circuit CP2 at its set terminal. The SR latch circuit 74 outputs a low level of the control signal SC2 to the transistor TS2 when the reset signal RESET becomes active. By contrast, the SR latch circuit 74 outputs a high level of the control signal SC2 to the transistor TS2 when the comparison result signal CQ2 from the comparison circuit CP2 becomes active.

In the normal state, for example, with the reset signal RESET being active, the SR latch circuit 74 is in the reset state, allowing the SR latch circuit 74 to output a low level of the control signal SC2. The transistor TS2, which is an N-type transistor, is off when the control signal SC2 is low.

When the bias voltage VH becomes higher than the predetermined voltage VB2, detecting an abnormal condition, the output signal CQ2 of the comparison circuit CP2 becomes active. This puts the SR latch circuit 74 in the set state, allowing the SR latch circuit 74 to output a high level of the control signal SC2. As a result, the N-type transistor TS2 is turned on, setting the gate node NG2 to the voltage level of the power supply VSS. In this way, when an abnormal condition is detected, the gate-source voltage of the transistor Q2 is set to a low voltage, permitting prevention or reduction of device breakdown of the transistor Q2.

Once being put in the set or reset state, the SR latch circuit 74 retains the state. Accordingly, when the SR latch circuit 74 is put in the reset state with the reset signal RESET becoming active in the normal state, the reset state is retained, and thus the off state of the transistor TS2 is also maintained.

When an abnormal condition is detected, putting the SR latch circuit 74 in the set state, the set state is retained, and thus the on state of the transistor TS2 is also maintained. Accordingly, the gate-source voltage of the transistor Q2 can be set to a low voltage continuously without fail, permitting improvement of reliability, etc.

6. DMOS Structure

In this embodiment, transistors having a double-diffused metal oxide semiconductor (DMOS) structure are used as the transistors constituting the bridge circuit 10. Details of an example DMOS transistor will be described as follows.

Figure 13:
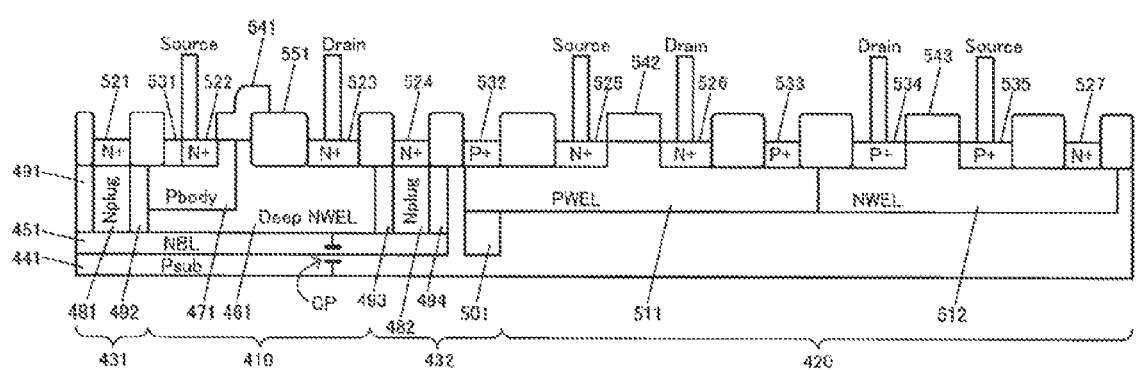
FIG. 13 shows a first example of a DMOS-structure circuit device.

FIG. 13 is a cross-sectional view of a semiconductor device as a circuit device, which is a first example of a circuit device using a DMOS transistor. Note that a description will be made hereinafter taking an N-type DMOS transistor as an example for the sake of simplicity.

In FIG. 13, provided on a substrate are a first region 410 where a first circuit is placed, a second region 420 where a second circuit is placed, a boundary region 431 provided at one end of the first region 410, and a boundary region 432 provided between the first region 410 and the second region 420. The first circuit is the bridge circuit 10 constituted by a DMOS transistor. The second circuit is a circuit constituted by a complementary metal oxide semiconductor (CMOS) transistor, which includes the pre-driver circuit 20, the control circuit 30, the bias circuit 40, the abnormal condition detection circuits 60, 70, 80, and 90, the comparison circuit CP, the reference voltage generation circuit, etc.

In the first region 410, an N-type transistor having a DMOS structure (hereinafter referred to as an N-type DMOS) is formed. More specifically, an N-type (N$^+$) buried layer (NBL) 451 is formed on a P-type substrate 441 that is a silicon substrate, and a deep N-type well 461 of the N-type DMOS is formed on the N-type buried layer 451. A P-type body 471 (P-type impurity layer) is formed on the source side of the deep N-type well 461, and a P-type layer 531 (P-type impurity layer) and an N-type layer 522 (N-type impurity layer) are formed on the P-type body 471. The N-type layer 522 corresponds to the source region of the N-type DMOS. An N-type layer 523 corresponding to the drain region of the N-type DMOS is formed on the drain side of the deep N-type well 461. An insulating layer 551 (e.g., LOCOS) is formed on the deep N-type well 461 so as to be in contact with the N-type layer 523, and a gate layer 541 (e.g., a polysilicon layer) is formed above the P-type body 471, the deep N-type well 461, and the insulating layer 551.

In the boundary region 431, an N-type plug 481 (N-type impurity layer) for supplying a potential to the N-type buried layer 451 is provided. More specifically, the N-type plug 481 is formed on the N-type buried layer 451, P-type layers 491 and 492 are formed on both sides of the N-type plug 481, and an N-type layer 521 is formed on the N-type plug 481. A potential given to the N-type layer 521 is thus supplied to the N-type buried layer 451 via the N-type plug 481. The same voltage as the voltage of the drain (N-type layer 523) is supplied to the N-type layer 521.

In a part of the boundary region 432 closer to the first region 410, an N-type plug 482 for supplying a potential to the N-type buried layer 451 is provided. The configuration of the N-type plug 482 is similar to that of the N-type plug 481. In another part of the boundary region 432 closer to the second region 420, a P-type (P$^+$) buried layer (PBL) 501 for supplying a potential to the P-type substrate 441 is provided. More specifically, the P-type buried layer 501 is formed on the P-type substrate 441, a P-type well 511 is formed on the P-type buried layer 501, and a P-type layer 532 is formed on the P-type well 511. The potential given to the P-type layer 532 is supplied to the P-type substrate 441 via the P-type well 511 and the P-type buried layer 501. The low-potential side power supply voltage is supplied to the P-type layer 532.

In the second region 420, an N-type transistor (hereinafter referred to as an NMOS) and a P-type transistor (hereinafter referred to as a PMOS) of a CMOS structure are formed. More specifically, the P-type well 511 (e.g., a medium-voltage P-type well (MV PWELL)) of the NMOS is formed on the P-type substrate 441, and an N-type layer 525 and an N-type layer 526 are formed on the P-type well 511 as the N-type source region and the N-type drain region, respectively, of the NMOS. A gate layer 542 is formed above the P-type well 511 between the N-type layers 525 and 526. A P-type layer 533 for supplying a potential to the P-type well 511 is further formed on the P-type well 511. The low-potential side power supply voltage is supplied to the P-type layer 533.

An N-type well 512 (e.g., a medium-voltage N-type well (MV NWELL)) of the PMOS is formed on the P-type substrate 441, and a P-type layer 535 and a P-type layer 534 are formed on the N-type well 512 as the P-type source region and the drain region, respectively, of the PMOS. A gate layer 543 is formed above the N-type well 512 between the P-type layers 534 and 535. An N-type layer 527 for supplying a potential to the N-type well 512 is further formed on the N-type well 512. The high-potential side power supply voltage, for example, is supplied to the N-type layer 527.

When the bridge circuit 10 constituted by the DMOS transistors drives the motor with a chopping current, a large current flows to the drain (N-type layer 523) of the DMOS transistor. Since the large current is turned on/off (or the direction of the flow is reversed) by the chopping operation, the voltage of the drain largely fluctuates. The N-type layer 523 as the drain is connected to the N-type buried layer 451 via the deep N-type well 461, and a parasitic capacitance CP is present between the N-type buried layer 451 and the P-type substrate 441 due to their PN junction. Therefore, the voltage fluctuation at the drain is conveyed to the P-type substrate 441 via the parasitic capacitance CP, and then to the second region 420 via the P-type substrate 441. In the second region 420, where the P-type substrate 441 is in contact with the P-type well 511 and the N-type well 512 of the CMOS transistor, the voltage fluctuation of the P-type substrate 441 affects the circuit constituted by the CMOS transistor.

For example, in FIG. 2, the comparison circuit CP compares the voltage VS at one terminal of the sense resistor RS with the reference voltage VR, thereby keeping the chopping current flowing to the bridge circuit 10 constant. At this time, if the comparison circuit CF and the circuit that generates the reference voltage VR are affected by the voltage fluctuation of the P-type substrate 441, the reference voltage VR will fluctuate and the comparison precision of the comparison circuit CP will decrease, raising the possibility of occurrence of variations in the chopping current.

Also, a regenerative current flows from the power supply VSS toward the power supply VBB during the decay period. For this reason, the drain voltage of the transistor Q3 becomes lower than the voltage VSS (GND) due to a voltage drop of the sense resistor RS. When this occurs, in the DMOS structure in FIG. 13, the N-type buried layer 451 connected to the drain becomes lower than the voltage VSS, causing a forward voltage between the N-type buried layer 451 and the P-type substrate 441. The voltage of the P-type substrate 441 will therefore be swung with the flowing-in current. Thus, there is another cause of swinging of the voltage of the P-type substrate 441, in addition to the one occurring via the parasitic capacitance CP.

Figure 14:
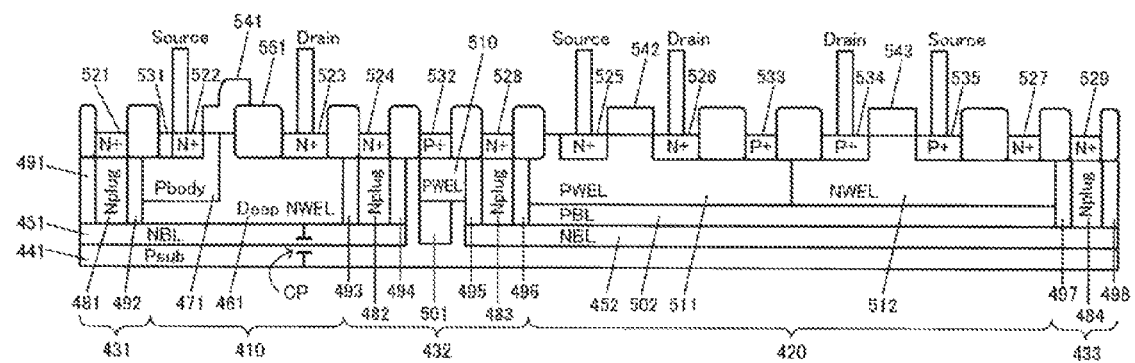
FIG. 14 shows a second example of the DMOS-structure circuit device.

FIG. 14 shows a second example of a circuit device using a DMOS transistor. The second example in FIG. 14 is to solve the problem with the first example in FIG. 13.

On a substrate, provided are a first region 410 where a first circuit is placed, a second region 420 where a second circuit is placed, a boundary region 431 provided at one end of the first region 430, a boundary region 432 provided between the first region 410 and the second region 420, and a boundary region 433 provided at one end of the second region 420. Since the configurations of the first region 410 and the boundary region 431 are similar to those in FIG. 13, a description of these regions is omitted here.

In the second region 420, an N-type buried layer 452 for isolating the CMOS transistor from the P-type substrate 441 is formed. More specifically, the N-type buried layer 452 is formed on the P-type substrate 441, and a P-type layer 502 is formed on the N-type buried layer 452. An NMOS transistor and a PMOS transistor are formed on the P-type layer 502. The configurations of these transistors are similar to those in FIG. 13. The P-type layer 502 may be a P-type buried layer. For example, the portion of the P-type layer 502 located under an N-type well 512 may be a P-type buried layer, and the portion thereof under a P-type well 511 may be a non-buried P-type layer. Alternatively, the P-type layer 502 may be formed only under the N-type well 512, and the P-type well 511 may be in contact with the N-type buried layer 452.

In a part of the boundary region 432 closer to the first region 410, an N-type plug 482 is provided as in FIG. 13. In another part of the boundary region 432 closer to the second region 420, an N-type plug 483 for supplying a potential to the N-type buried layer 452 is provided. More specifically, the N-type plug 483 is formed on the N-type buried layer 452, P-type layers 495 and 496 are formed on both sides of the N-type plug 483, and an N-type layer 528 is formed on the N-type plug 483. The potential given to the N-type layer 528 is thus supplied to the N-type buried layer 452 via the N-type plug 483. The high-potential side power supply voltage is supplied to the N-type layer 528.

In the boundary region 432, also, a P-type buried layer 501 for supplying a potential to the P-type substrate 441 is provided between the N-type plug 482 and the N-type plug 483. The configuration of the P-type buried layer 501 is similar to that in FIG. 13, where the low-potential side power supply voltage given to a P-type layer 532 is supplied to the P-type substrate 441 via a P-type well 510 and the P-type buried layer 501.

In the boundary region 433, an N-type plug 484 for supplying a potential to the N-type buried layer 452 is provided. The configuration of the N-type plug 484 is similar to that of the N-type plug 483 in the boundary region 432, where the high-potential side power supply voltage given to an N-type layer 529 is supplied to the N-type buried layer 452 via the N-type plug 484.

With the configuration in FIG. 14, having the second N-type buried layer 452 isolated from the first N-type buried layer 451, the second circuit constituted by the CMOS transistor can be isolated from the P-type substrate 441.

When the DMOS transistor performs switching operation, the swing of the drain potential is conveyed from the first N-type buried layer 451 to the P-type substrate 441 via the parasitic capacitance CP, etc., as described with reference to FIG. 13, for example.

In regard to the above, in the configuration in FIG. 14, where the second circuit is isolated from the P-type substrate 441, even when the potential of the P-type substrate 441 swings, the second circuit is less likely to be affected by this swing, permitting operation with reduced errors.

The buried layer as used herein refers to an impurity layer formed below the impurity layers (e.g., the P-type body 471 and the deep N-type well 461 in FIG. 14) in a surface portion of the substrate. More specifically, an N-type impurity or a P-type impurity is implanted in the silicon substrate, and an epitaxial layer (silicon single-crystal layer) is grown on the impurity-implanted layer, to form a buried layer under the epitaxial layer.

In FIG. 14, the region of the second circuit (second region 420) is surrounded by the N-type plug region (the region where the N-type plugs 483 and 484 are provided as viewed from top) that sets the potential of the second N-type buried layer 452.

With the above configuration, a bathtub-shaped N-type region can be formed by the second N-type buried layer 452 and the N-type plug region surrounding the buried layer 452. By this N-type region, the region of the second circuit can be isolated from the P-type substrate 441. In addition, even if a swing of the potential of the P-type substrate is conveyed to the N-type buried layer 452, the second circuit region can be isolated without fail because the potential of the buried layer 452 has been set via the N-type plugs. There is also an advantage that, since the second N-type buried layer 452 can be set to a potential (e.g., a power supply voltage) higher than the P-type substrate 441, isolation can be ensured by reverse-voltage PN junction.

7. Electronic Apparatus

Figure 15:
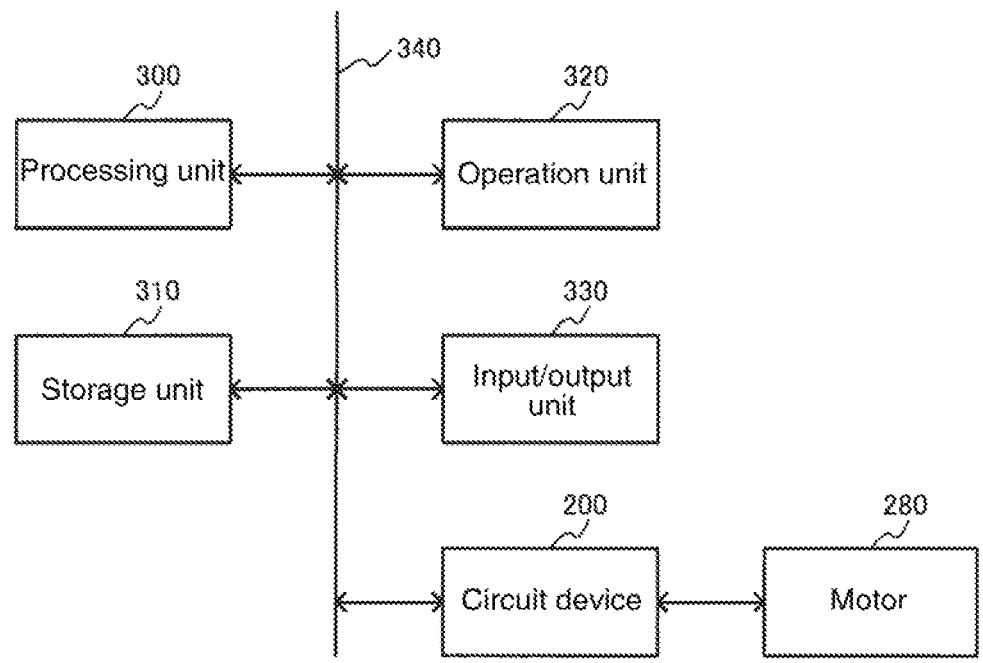
FIG. 15 shows an example configuration of an electronic apparatus.

FIG. 15 shows an example configuration of an electronic apparatus to which a circuit device 200 (motor driver) of this embodiment is applied. The electronic apparatus includes a processing unit 300, a storage unit 310, an operation unit 320, an input/output unit 330, the circuit device 200, a bus 340 that connects these units to one another, and a motor 280. Note that, while a printer where a head and a paper feeder are controlled by motor drive is to be described as an example, this embodiment is not limited to this, but can be applied to various types of electronic apparatuses.

The input/output unit 330 is constituted by interfaces such as a USB connector and wireless LAN, to which image data and document data are input. The input data is stored in the storage unit 310 which is an internal storage such as a DRAM, for example. When receiving a print instruction via the operation unit 320, the processing unit 300 starts printing of data stored in the storage unit 310. The processing unit 300 issues an instruction to the circuit device 200 (motor driver) in accordance with the print layout of the data, and the circuit device 200 rotates the motor 280 based on the instruction to execute movement of the head or paper feeding.

While a preferred embodiment of the invention has been described in detail, it is to be easily understood by those skilled in the art that various modifications that do not substantially depart from the novel matters and advantages of the invention may be made. It is therefore construed that all of such modifications are included in the scope of the invention. For example, a term having appeared together with a broader or synonymous different term at least once in the description or any drawing can be replaced with the different term at any position in the description or the drawings. Also, any combination of the preferred embodiment and the modifications is to be included in the scope of the invention. It is also to be understood that the configurations and operations of the circuit device and the electronic apparatus, the technique of detecting an abnormal condition, the techniques of controlling the switches, the technique of driving the motor, etc. are not limited to those described in the preferred embodiment, but can be altered in various ways.

The entire disclosure of Japanese Patent Application No. 2013-61555, filed Mar. 25, 2013 is expressly incorporated by reference herein.

What is claimed is:

1. A circuit device comprising:
a bridge circuit having a first transistor provided between a node of a high-potential side power supply and a first node and a second transistor provided between the first node and a node of a low-potential side power supply;
a pre-driver circuit that outputs a first drive signal and a second drive signal to a first gate node of the first transistor and a second gate node of the second transistor, respectively;
a bias circuit that supplies a bias voltage as a power supply voltage that sets a low level of the first drive signal; and
an abnormal condition detection circuit that detects an abnormal condition where a high voltage higher than a normal voltage is applied between a gate and a source of the first transistor, and, if detecting the abnormal condition, sets a gate-source voltage of the first transistor to a voltage lower than the high voltage.

2. The circuit device according to claim 1,
wherein the abnormal condition detection circuit is provided between the node of the high-potential side power supply and the first gate node of the first transistor, and includes a switch circuit that is turned on when the abnormal condition is detected.

3. The circuit device according to claim 2,
wherein the abnormal condition detection circuit includes a voltage detection circuit that detects whether or not the bias voltage has become lower than a predetermined voltage and outputs a control signal that turns on the switch circuit when the bias voltage has become lower than the predetermined voltage.

4. The circuit device according to claim 3,
wherein the switch circuit is constituted by a P-type transistor for switch use provided between the node of the high-potential side power supply and the first gate node of the first transistor, and
the voltage detection circuit includes:
a comparison circuit that compares the bias voltage with the predetermined voltage; and
an SR latch circuit that receives a set signal at its set terminal and a comparison result signal from the comparison circuit at its reset terminal, and outputs a high level of the control signal to the P-type transistor for switch use when the set signal becomes active and a low level of the control signal to the P-type transistor for switch use when the comparison result signal becomes active.

5. The circuit device according to claim 1,
wherein the pre-driver circuit includes a P-type transistor for pre-driver use and an N-type transistor for pre-driver use provided in series between the node of the high-potential side power supply and a node of supplying the bias voltage, and
the bias circuit supplies the bias voltage to a source node of the N-type transistor for pre-driver use.

6. The circuit device according to claim 5,
wherein the abnormal condition detection circuit includes a switch circuit for pre-driver protection that is provided between the node of the high-potential side power supply and the source node of the N-type transistor for pre-driver use and is turned on when the abnormal condition is detected.

7. The circuit device according to claim 1,
wherein the first transistor and the second transistor are high-voltage transistors, and
transistors constituting the pre-driver circuit, the bias circuit, and the abnormal condition detection circuit are low-voltage transistors.

8. The circuit device according to claim 7,
wherein the first transistor and the second transistor are transistors having a DMOS structure.

9. An electronic apparatus comprising the circuit device according to claim 1.

10. A circuit device comprising:
a bridge circuit having a first transistor provided between a node of a high-potential side power supply and a first node and a second transistor provided between the first node and a node of a low-potential side power supply;
a pre-driver circuit that outputs a first drive signal and a second drive signal to a first gate node of the first transistor and a second gate node of the second transistor, respectively;
a bias circuit that supplies a bias voltage as a power supply voltage that sets a high level of the second drive signal; and
an abnormal condition detection circuit that detects an abnormal condition where a high voltage is applied between a gate and a source of the second transistor, and, if detecting the abnormal condition, sets a gate-source voltage of the second transistor to a voltage lower than the high voltage.

11. The circuit device according to claim 10,
wherein the pre-driver circuit includes a P-type transistor for pre-driver use and an N-type transistor for pre-driver use provided in series between a node of supplying the bias voltage and the node of the low-potential side power supply, and
the bias circuit supplies the bias voltage to a source node of the P-type transistor for pre-driver use.

12. The circuit device according to claim 11,
wherein the abnormal condition detection circuit includes a switch circuit for pre-driver protection that is provided between the source node of the P-type transistor for pre-driver use and the node of the low-potential side power supply and is turned on when the abnormal condition is detected.

13. The circuit device according to claim 10,
wherein the abnormal condition detection circuit is provided between the second gate node of the second transistor and the node of the low-potential side power supply, and includes a switch circuit that is turned on when the abnormal condition is detected.

14. The circuit device according to claim 13,
wherein the abnormal condition detection circuit includes a voltage detection circuit that detects whether or not the bias voltage has become higher than a predetermined voltage and outputs a control signal that turns on the switch circuit when the bias voltage has become higher than the predetermined voltage.

15. The circuit device according to claim 14,
wherein the switch circuit is constituted by an N-type transistor for switch use provided between the second gate node of the second transistor and the node of the low-potential side power supply, and
the voltage detection circuit includes:
a comparison circuit that compares the bias voltage with the predetermined voltage; and
an SR latch circuit that receives a reset signal at its reset terminal and a comparison result signal from the comparison circuit at its set terminal, and outputs a low level of the control signal to the N-type transistor for switch use when the reset signal becomes active and a high level of the control signal to the N-type transistor for switch use when the comparison result signal becomes active.

16. The circuit device according to claim 10,
wherein the first transistor and the second transistor are high-voltage transistors, and
transistors constituting the pre-driver circuit, the bias circuit, and the abnormal condition detection circuit are low-voltage transistors.

17. The circuit device according to claim 16,
wherein the first transistor and the second transistor are transistors having a DMOS structure.

18. An electronic apparatus comprising the circuit device according to claim 10.

* * * * *